(12) United States Patent
Chang et al.

(10) Patent No.: US 12,360,460 B2
(45) Date of Patent: Jul. 15, 2025

(54) SYSTEM AND METHOD FOR SELECTING PHOTOLITHOGRAPHY PROCESSES

(71) Applicant: Taiwan Semiconductor Manufacturing Co., Ltd., Hsinchu (TW)

(72) Inventors: Shih-Ming Chang, Hsinchu (TW); Ken-Hsien Hsieh, Hsinchu (TW); Yu-Tien Shen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 653 days.

(21) Appl. No.: 17/566,563

(22) Filed: Dec. 30, 2021

(65) Prior Publication Data

US 2022/0357669 A1 Nov. 10, 2022

Related U.S. Application Data

(60) Provisional application No. 63/185,924, filed on May 7, 2021.

(51) Int. Cl.
*G03F 7/00* (2006.01)
*G03F 1/22* (2012.01)
*G03F 7/20* (2006.01)
*G06F 30/398* (2020.01)

(52) U.S. Cl.
CPC ............ *G03F 7/70433* (2013.01); *G03F 1/22* (2013.01); *G03F 7/70483* (2013.01); *G06F 30/398* (2020.01); *G03F 7/2004* (2013.01)

(58) Field of Classification Search
CPC ............. G03F 7/70483; G03F 7/70491; G03F 7/70508; G03F 7/70425; G03F 7/7045
See application file for complete search history.

(56) References Cited

U.S. PATENT DOCUMENTS

| | | | | |
|---|---|---|---|---|
| 5,243,377 A * | 9/1993 | Umatate | ............ | G03F 7/70525 355/53 |
| 5,870,176 A * | 2/1999 | Sweatt | ................ | G03F 7/70291 359/872 |
| 10,713,411 B1 | 7/2020 | Chang | | |
| 2003/0054580 A1* | 3/2003 | Yamamoto | ............ | G03F 7/7045 438/22 |
| 2005/0022151 A1 | 1/2005 | Rittman et al. | | |
| 2005/0074698 A1* | 4/2005 | Borodovsky | ....... | G03F 7/70408 430/394 |
| 2011/0296360 A1 | 12/2011 | Wang et al. | | |
| 2013/0080980 A1* | 3/2013 | Wang | .................... | G06F 30/398 716/52 |

(Continued)

FOREIGN PATENT DOCUMENTS

CN 106463350 A 2/2017
CN 109559979 A 4/2019

*Primary Examiner* — Steven H Whitesell
(74) *Attorney, Agent, or Firm* — Seed IP Law Group

(57) ABSTRACT

A semiconductor processing system includes a first photolithography system and a second photolithography system. The semiconductor processing system includes a layout database that stores a plurality of layouts indicating features to be formed in a wafer. The semiconductor processing system includes a layout analyzer that analyzes the layouts and selects either the first photolithography system or the second photolithography system based on dimensions of features in the layouts.

20 Claims, 7 Drawing Sheets

(56) References Cited

U.S. PATENT DOCUMENTS

| | | |
|---|---|---|
| 2014/0245238 A1 | 8/2014 | Wang et al. |
| 2016/0026748 A1 | 1/2016 | Hassan et al. |
| 2017/0235228 A1* | 8/2017 | Chandhok ............. G03F 7/0035 355/27 |
| 2020/0004137 A1* | 1/2020 | Liu ........................... G03F 1/68 |

* cited by examiner

SYSTEM AND METHOD FOR SELECTING PHOTOLITHOGRAPHY PROCESSES

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate. One way to increase the density of transistors formed in a given area is to reduce the size of the features of the transistors and the sizes of the corresponding interconnection structures associated with the transistors.

Photolithography processes are utilized to pattern layers of a semiconductor wafer in accordance with features to be formed in the semiconductor wafer. The size of features that can be formed is affected, on the lower end, by the type of the photolithography process utilized. Various types of photolithography systems may be utilized to perform photolithography processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
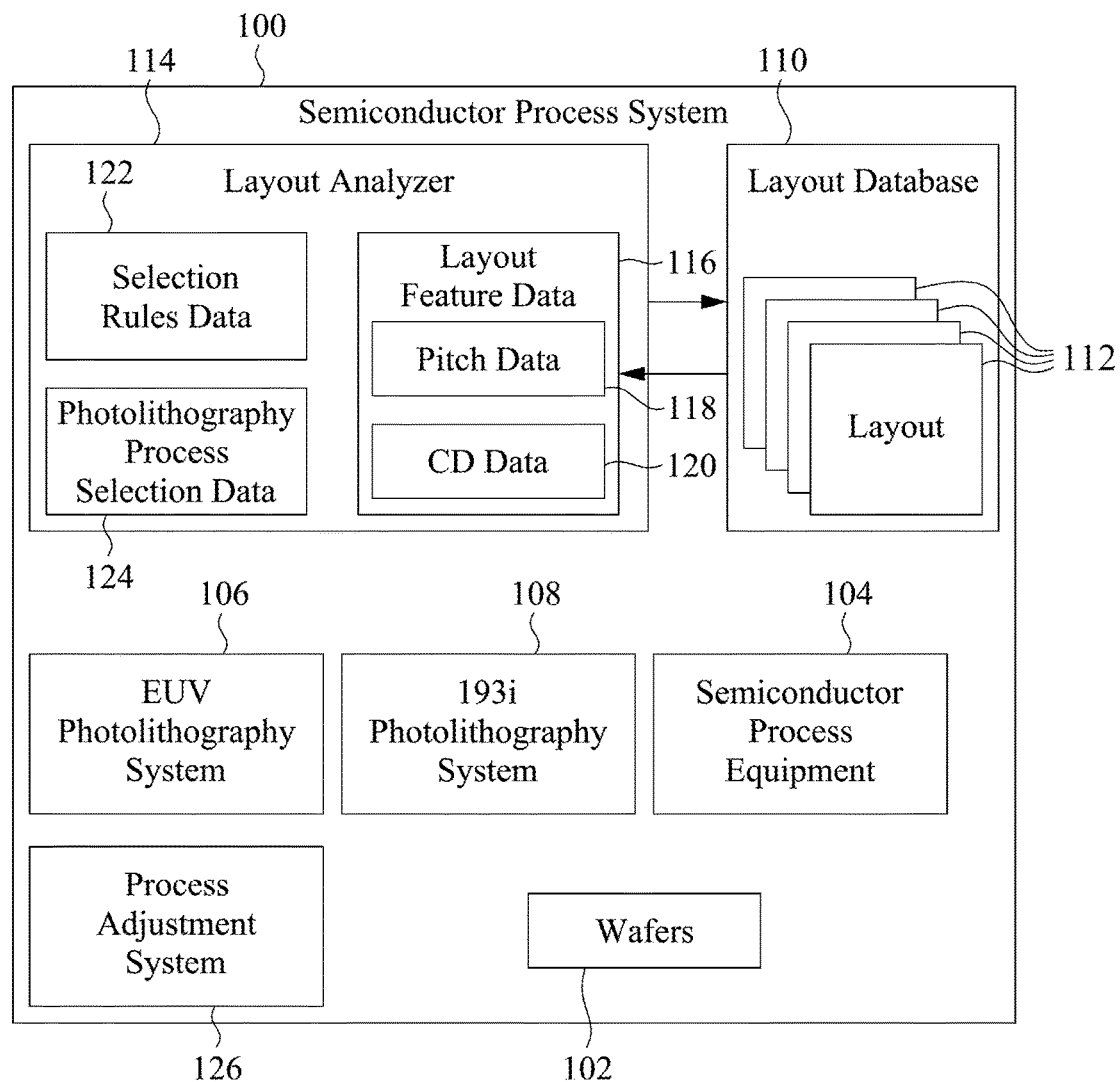
FIG. 1 is a block diagram of a semiconductor process system, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide a semiconductor process system that selects among different types of photolithography processes for each of a plurality of layouts to be utilized in processing semiconductor wafers. The semiconductor process system includes a layout database and a layout analyzer. The layout database includes the layout data associated with each photolithography mask to be utilized in processing semiconductor wafers. The layout analyzer analyzes the layout of features associated with each mask. The layout analyzer may analyze the distribution of critical dimensions (CDs), pitches, and other aspects associated with the layouts. The layout analyzer processes the layout feature data in accordance with selection rules data.

The selection rules data determines which type of photolithography process should be utilized for a given layout. The layout analyzer selects, for each layout, a type of photolithography process to be utilized in imparting the layout onto a semiconductor wafer.

The layout analysis and photolithography process selection has various benefits. For example, when very small pitches, CDs, or other dimensional aspects of a layout are detected by the layout analyzer, the layout analyzer selects an extreme ultraviolet (EUV) photolithography process that can most reliably impart the corresponding pattern to the semiconductor wafer. In cases in which a layout does not include very small pitches, CDs, or other dimensional aspects, the layout analyzer may select photolithography processes other than EUV photolithography processes. These other photolithography processes may be well suited to imparting patterns with relaxed dimensional constraints. The result is that photolithography resources are effectively managed, layout features are properly and reliably imparted to wafers, and wafer yields increase.

FIG. 1 is a block diagram of a semiconductor process system 100, in accordance with some embodiments. The semiconductor process system 100 may correspond to a system that processes wafers 102. The semiconductor process system 100 may eventually dice the wafers 102 into individual integrated circuits. The semiconductor process system 100 performs a plurality of semiconductor processes on the wafers 102 to form semiconductor layers, dielectric layers, conductive layers, and various other structures or components that result in fully functioning integrated circuits.

The semiconductor process system 100 includes semiconductor process equipment 104. Typically, semiconductor wafers 102 undergo a large number of processes during fabrication. These processes can include thin-film depositions, etching processes, dopant implantation processes, annealing processes, epitaxial growth processes, chemical mechanical planarization (CMP) processes, and other types of processes. The semiconductor process equipment 104 includes tools and other equipment to perform semiconductor processes on the wafers.

In some embodiments, the semiconductor process equipment 104 includes a thin film deposition chamber. The thin-film deposition chamber can include a chemical vapor deposition chamber, a sputtering chamber, a physical vapor deposition chamber, an atomic layer deposition chamber, a plasma enhanced vapor deposition chamber, an epitaxial growth chamber, or other types of thin-film deposition chambers. Those of skill in the art will recognize, in light of the present disclosure, that the semiconductor process equipment 104 can include a thin-film deposition chamber other than those described above without departing from the scope of the present disclosure.

In some embodiments, the semiconductor process equipment 104 includes an etching chamber. The etching chamber is utilized to etch thin films deposited on the wafer 102. The etching chamber can include a chamber for wet etching, dry etching, plasma etching, or other types of etching processes. Etching chambers other than those described above can be utilized without departing from the scope of the present disclosure.

In some embodiments, the semiconductor process equipment 104 includes a dopant implantation chamber. The dopant implantation chamber can include an ion implantation chamber in which the wafer 102 is bombarded with dopant ions. The dopant ions are implanted within the wafer 102 in accordance with selected parameters for the ion implantation process. The dopant implantation chamber can include types of dopant implantation other than those described above without departing from the scope of the present disclosure.

The semiconductor process equipment 104 can include equipment that assists in thin-film deposition processes, etching processes, ion implantation processes, annealing processes, photolithography processes, and other types of processes. Some of the semiconductor process equipment 104 may be positioned entirely within a semiconductor process chamber. Some of the semiconductor process equipment 104 may be positioned partially within the semiconductor process chamber 102 and partially external to a semiconductor process chamber. Some of the semiconductor process equipment 104 may be positioned entirely external to a semiconductor process chamber.

The semiconductor process equipment 104 can include electrical components for generating electric fields, voltages, magnetic fields, electrical signals, or other types of electrical effects. Accordingly, the semiconductor process equipment 104 can include electrodes, wires, radiofrequency power sources, transmitters, receivers, or other types of electrical equipment that may be utilized in semiconductor processes.

The semiconductor process equipment 104 can include equipment for managing gas or fluid within a semiconductor process chamber. The processing equipment can include components for introducing gasses or fluids into the semiconductor process chamber, for removing gasses or fluids from the semiconductor process chamber, for monitoring and controlling the flow, presence, or composition of gasses within the process chamber.

The semiconductor process system 100 includes an EUV photolithography system 106 and a 193i photolithography system 108. Either of the photolithography systems 106 and 108 can be utilized for various photolithography patterning processes. A photolithography patterning process typically includes depositing photoresist on the surface of the wafer 102 and then exposing the photoresist to photolithography light via a mask. The mask includes a pattern corresponding to the desired layout of features at a particular layer of the wafer 102 or on a particular stage of processing of the wafer 102. While in many cases, either the EUV photolithography system 106 or the 193i photolithography system 108 can be utilized, there are situations in which it may be more beneficial to utilize one or the other. This may be understood, in part, with a basic description of the EUV photolithography system 106 and the 193i photolithography system 108. While FIG. 1 illustrates an EUV photolithography system 106 and a 193i photolithography system 108, principles of the present disclosure can be extended to a first photolithography system and a second photolithography system different than the first photolithography system.

The EUV photolithography system 106 generates EUV light. As used herein, the terms "EUV light" and "EUV radiation" can be utilized interchangeably. In some embodiments, the EUV light has a wavelength between 10 nm and 15 nm. In one example, the EUV light has a central wavelength of 13.5 nm. In photolithography processes, one of the factors that affects the size of features that can be formed in a wafer is the wavelength of the light utilized in the photolithography processes. Because EUV light has a very small wavelength, EUV light can be utilized to define very small features on the wafer 102. Different EUV generation processes can provide different wavelength ranges of EUV light and different center wavelengths. Accordingly, the EUV light can have different ranges of wavelengths and different center wavelengths than those described above without departing from the scope of the present disclosure.

The process for generating EUV light may be quite complex. In one example, the EUV photolithography system 106 is a plasma pulse EUV generation system. The EUV photolithography system 106 generates EUV light by passing tin droplets into an EUV generation chamber. Each droplet is irradiated with one or more precision laser pulses. The precision laser pulses generate a plasma from each droplet. The plasmatized tin droplets emit EUV light with a central wavelength of 13.5 nm. The EUV light scatters and impacts a large collector mirror. The large collector mirror reflects and focuses the EUV light toward an EUV scanner. The EUV scanner includes precision optics that reflect, guide, focus, and condition the EUV light reflects off of an EUV reticle or mask within the scanner. After reflecting off of the EUV reticle or mask, the EUV light includes the pattern of the EUV reticle or mask. The EUV light is focused onto the wafer 102 to impart a pattern of the reticle or mask onto a layer of photoresist on the wafer 102. In one example, the EUV photolithography system 106 can generate single exposure pitches as small as 28 nm.

The 193i photolithography system 108 generates ultraviolet (UV) light having a central wavelength of 193 nm. The UV light is passed through or reflected off of a mask or reticle. Additional lenses and mirrors direct the light onto the wafer 102. The final lens is a layer of liquid positioned on the wafer 102. The wavelength of the UV light contracts within the liquid. The contraction of the wavelength of the UV light within the liquid allows for smaller pitches to be formed in the photoresist that might otherwise be formed without the aid of the liquid layer. In one example, the minimum single exposure resolution of a 193i photolithography system is 71 nm.

The semiconductor process system 100 may utilize either the EUV photolithography system 106 or the 193i photolithography system 108 for each photolithography process. The benefits and drawbacks of these different photolithography processes will be described in further detail below and may be more properly interested after describing the various pattern layouts associated with processing of a wafer 102.

The semiconductor process system 100 includes a layout database 110. The layout database 110 includes a plurality of layouts 112. Each layout 112 indicates the pattern of features to be formed in the wafer 102 at a particular stage of processing. For example, a first layout may indicate the areas of a semiconductor substrate at which N-wells will be formed. A second layout may indicate the areas of the semiconductor substrate at which P-wells will be formed. A third layout 112 may indicate the areas of which the trenches will be etched to define semiconductor fins. Another layout may indicate the areas in which metal lines and conductive vias will be formed in a first interlevel dielectric layer. Another layout may indicate the areas in which metal lines and conductive vias will be formed in a second interlevel dielectric layer. A large number of layouts 112 may be utilized in processing the wafer 102 from start to finish.

In general, a photolithography process may be associated with each layout 112. A mask or reticle may be generated for each layout 112. The mask or reticle carries the pattern of the layout 112 or a seed pattern from which the layout is effected after various semiconductor processes have been performed. A photolithography process imparts the pattern of the mask or reticle onto the photoresist on the wafer 102. One example of a layout is a simulated graphic database system (GDS) layout, though other types or formats of layouts can be used. The layouts 112 may be generated utilizing one or more specialized software programs for generating layouts for semiconductor processing, a photolithography mask can be generated in accordance with the layout. As described previously, the semiconductor process system 100 may select from either the EUV photolithography system 106 or the 193i photolithography system 108 for each layout.

The semiconductor process system 100 includes a layout analyzer 114. The layout analyzer 114 is configured to analyze each layout 112. The layout analyzer 114 is configured to select, for each layout 112, either the EUV photolithography system 106 or the 193i photolithography system 108 to perform the photolithography processes associated with that layout.

When the layout analyzer 114 analyzes a layout 112, the layout analyzer 114 extracts layout feature data 116 associated with the layout 112. The layout feature data 116 can include data related to the sizes, shapes, and positions of features in the layout 112. The layout analyzer 114 determines whether the EUV photolithography system 106 or the 193i photolithography system 108 should be utilized for performing a photolithography process associated with the layout 112 based on the layout feature data 116 extracted by the layout analyzer 114 from the layout 112.

In some embodiments, the layout feature data 116 includes pitch data 118. The pitch data 118 includes data related to one or more pitches associated with the layout 112. A pitch can correspond to the distance between analogous portions of two adjacent features. For example, if the layout 112 includes two adjacent metal lines, then the pitch associated with the two metal lines can be the distance between an edge of a first metal line and the same edge of a second adjacent metal line.

The pitch data 118 can include the pitches associated with a large number of adjacent features in the layout 112. In some cases, the pitch data 118 can include every pitch associated with the layout 112. In other cases, the pitch data 118 can include pitches associated with a sampling of features associated with the layout 112. In some cases, the pitch data 118 can include pitches associated with features in a selected area of the layout 112. In one example, the layout analyzer 114 extracts the pitch data 118 associated with a 5 μm by 5 μm portion of a layout 112, though other area values can be utilized without departing from the scope of the present disclosure.

The pitch data 118 includes a threshold pitch value. The pitch data 118 can indicate whether each pitch in a layout 112 is less than the threshold pitch value. The threshold pitch value may correspond to a pitch value equal to or less than a minimum single exposure pitch value associated with the 193i photolithography system 108. The pitch data 118 can indicate the percentage of pitches in a layout 112, or in a sampled area of the layout 112, that are less than or equal to the threshold pitch value. In an example in which the minimum single exposure pitch value of the 193i photolithography system 108 is 71 nm, then the threshold pitch value can be 71 nm. Alternatively, the threshold pitch value can be selected from a range of values between 65 and 75 nm. Other threshold pitch values can be utilized without departing from the scope of the present disclosure.

In some embodiments, the layout feature data 116 includes CD data 120. The CD data 120 includes data related to one or more CDs associated with the layout 112. The CD associated with a feature can correspond to the smallest dimension associated with that feature. For example, if the layout 112 includes a metal line with a length of 100 nm and a width of 20 nm, then the CD associated with that metal line can be the 20 nm associated with the width because the width is the smallest lateral dimension of the metal line.

The CD data 120 can include the pitches associated with a large number of adjacent features in the layout 112. In some cases, the CD data 120 can include the CD of every feature associated with the layout 112. In other cases, the CD data 120 can include CDs associated with a sampling of features associated with the layout 112. In some cases, the CD data 120 can include CDs associated with features in a selected area of the layout 112. In one example, the layout analyzer 114 extracts the CD data 120 associated with a 5 µm by 5 µm portion of a layout 112, though other area values can be utilized without departing from the scope of the present disclosure.

In some embodiments, the CD data 120 includes a threshold CD value. The CD data 120 can indicate whether each CD in a layout 112 is less than the threshold CD value. The threshold CD value may correspond to a CD value equal to or less than a minimum single exposure CD value associated with the 193i photolithography system 108. The CD data 120 can indicate the percentage of CDs in a layout 112, or in a sampled area of the layout 112, that are less than or equal to the threshold CD value.

The layout feature data 116 may also include information indicating whether there are variations in pitches between adjacent features or variations in CD between adjacent features. The layout feature data 116 may include ratios of adjacent pitches, ratios of adjacent CDs, indications as to whether there are both different CDs and different pitches associated with adjacent features.

The layout feature data 116 can also indicate the distance between corners of adjacent features. For example, in many cases features associated with a layout 112 include various shapes other than rectangular, circular, oblong, or elliptical. The corners or closest points of two adjacent features may be very close together and may be much smaller than a threshold distance from each other. Furthermore, corners of a single feature may be close together and may be much smaller than the threshold critical distance. Each of these factors may be useful in determining whether or not the layout should be implemented using the EUV photolithography system 106 or the 193i photolithography system 108.

The layout feature data 116 may also include information indicating whether there are variations in pitches between adjacent features or variations in CD between adjacent features. The layout feature data 116 may include ratios of adjacent pitches, ratios of adjacent CDs, indications as to whether there are both different CDs and different pitches associated with adjacent features.

The layout analyzer 114 may include selection rules data 122. The selection rules data 122 may include rules or guidelines for determining whether or not a particular layout 112 should be implemented using the EUV photolithography system 106 or the 193i photolithography system 108. The layout analyzer 114 compares the layout feature data 116 to the selection rules data 122. The layout analyzer 114 determines which of the photolithography system should be utilized to implement the layout based on the comparison of the selection rules data 122 to the layout feature data 116.

In some embodiments, the selection rules data 122 can determine whether the EUV photolithography system 106 or the 193i photolithography system 108 should be implemented based on whether or not one or more pitches of a layout 112 are smaller than a threshold pitch. In this case, if any pitch is smaller than a threshold pitch, then the layout analyzer 114 determines that the EUV photolithography system 106 should be utilized for the photolithography process associated with that layout. Otherwise, the 193i photolithography system 108 can be utilized.

In some embodiments, the selection rules data 122 can determine whether the EUV photolithography system 106 or the 193i photolithography system 108 should be implemented based on whether or not the percentage of pitches that are smaller than the threshold pitch is less than a threshold percentage. For example, the threshold percentage may be between 45% and 55%. If the percentage of pitches that are smaller than the threshold pitch is less than the threshold percentage, then the layout analyzer 114 can select the EUV photolithography system 106 to perform the photolithography process associated with the layout.

In some embodiments, the selection rules data 122 can include rules regarding threshold CDs. If one or more CDs associated with the layout 112 is less than a threshold CD, then the rules can indicate that the layout analyzer 114 should select the EUV photolithography system 106 to perform a photolithography process associated with that layout. In another example, if the percentage of CDs that are smaller than the threshold CD is less than a threshold percentage, then the selection rules data 122 can indicate that the layout analyzer 114 should select the EUV photolithography system 106 to perform the photolithography process associated with the layout.

In some embodiments, the selection rules data 122 can include rules related to both pitches and CDs. The selection rules data 122 can indicate that if one or more pitches and CDs are less than their respective thresholds, then the layout analyzer 114 should select the EUV photolithography system 106 perform the photolithography process associated with the layout. The selection rules data 122 can indicate that if the percentage of pitches and the percentage of CDs smaller than their respective thresholds are less than the respective threshold percentages, then the layout analyzer 114 should select the EUV photolithography system 106 to perform the photolithography process associated with the layout.

In some embodiments, the selection rules data 122 can include rules related to the distance between corners of adjacent features. If the distance between corners of adjacent features is less than a threshold distance, then the selection rules data 122 can indicate that the layout analyzer 114 should select the EUV photolithography system 106 to perform the photolithography process associated with the layout. The selection rules data 122 can also include data related to whether corners of a single feature may are closer together than a threshold distance, or whether a percentage of corners that are closer together than a threshold distance is less than a threshold percentage.

In some embodiments, the selection rules data 122 can include multiple rules related to pitches, CDs, distances between corners, and other characteristics. The selection rules data 122 may indicate that the layout analyzer 114 should select the EUV photolithography system 106 for a photolithography process based on satisfaction of all or some of the selection rules data 122.

In some embodiments, the layout analyzer 114 generates a layout score based on the layout feature data 116 and the selection rules data 122. The score can be based on the number of selection rules data that are satisfied (or violated) by the layout feature data 116. Selection of the EUV photolithography system 106 or the 193i photolithography system 108 can be based on the layout score. For example, the layout score associated with a layout can be compared to a threshold layout score and either the EUV photolithography system 106 or the 193i photolithography system 108 can be selected based on the comparison of the layout score to the threshold layout score.

The semiconductor process system 100 may also include a layout adjustment system. The layout adjustment system can adjust layouts after the layout analyzer 114 determines that an EUV process should be utilized. The layout adjustment system can modify design rules and layouts to match a EUV process scheme after determining that an EUV process should be utilized. In some cases, additional layouts may be generated if additional process steps will utilized. In some cases, some layouts may be modified and other layouts may be removed after determining that an EUV process should be utilized. In one example, the EUV process may result in the ability to place conductive vias closer together in a layout due to the differing design rules associated with an EUV process. The layout that defines placement of those conductive vias may need to be adjusted. Furthermore, the layouts of features above and below the conductive vias in a wafer may also need to be adjusted to account for the new placement of the conductive vias. Various types of layout adjustments can be performed based on the differing design rules associated with EUV processes. Accordingly, the layout adjustment system can automatically adjust layouts for compatibility after selection of the EUV results in changes to some feature placements.

The semiconductor process system 100 may also include a process adjustment system 126. If the layout analyzer 114 determines that the EUV photolithography system 106 should be utilized for a particular layout 112, when previously the 193i photolithography system 108 was utilized for that layout 112, then some adjustments to the overall semiconductor process may be implemented. For example, the number of exposures may need to be adjusted, deposition and etching processes for dielectric materials may be eliminated, or other aspects of the semiconductor processing may be changed if an EUV photolithography process replaces a 193i photolithography process. Further details regarding potential changes in process are provided below.

Figure 2A:
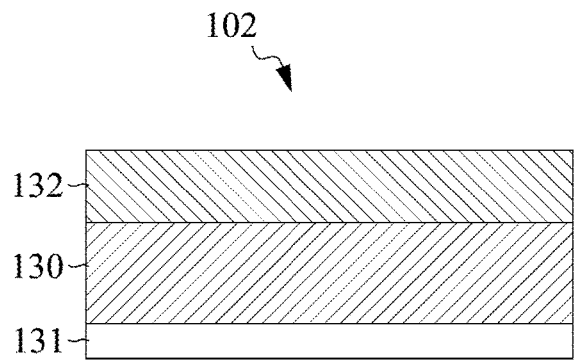
FIGS. 2A-2F are cross-sectional views of a wafer at intermediate stages of process, in accordance with some embodiments.

FIGS. 2A-2F are cross-sectional views of a wafer 102 during a stage of processing associated with an EUV photolithography process, in accordance with some embodiments. In FIG. 2A, the wafer includes a target layer 130 over a substrate 131. The target layer 130 may include a semiconductor substrate, a dielectric layer, an interlevel dielectric layer above a semiconductor substrate, or other types of layers that may be part of a wafer 102 at a particular stage of processing. The substrate 131 may include a semiconductor substrate, a Si layer, or other types of layers that may be part of a wafer 102 at a particular stage of processing. Various types of materials can be utilized for the target layer 130 without departing from the scope of the present disclosure.

The target layer 130 is covered in a layer of photoresist 132. The photoresist 132 can include a material that undergoes a physical change when exposed to light. Depending on the type of the material of the photoresist 132, the physical change may weaken or strengthen the portions of the photoresist 132 that are irradiated by the photolithography light. Various types of photoresist can be utilized without departing from the scope of the present disclosure.

Figure 2B:
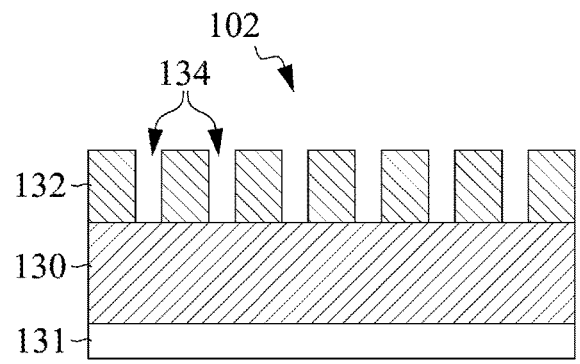

In FIG. 2B, the wafer has been exposed to EUV light as part of an EUV photolithography process. As described previously in relation to FIG. 1, the EUV light is generated in the EUV generation chamber and reflected off of a reticle or mask that includes the pattern associated with the desire layout. After the EUV light reflects off of the reticle, the EUV light carries the pattern of the reticle. The EUV light then irradiates the photoresist 132. Some portions of the photoresist 132 receives the EUV light while others do not receive EUV light, in accordance with the pattern of the reticle. In one example, the portions of the photoresist 132 that receive or are exposed to the EUV light undergo a structural change. After exposure to the EUV light, the photoresist is exposed to an etching process. The etching process may include a wet or dry etching process that selectively etches the exposed portions of the photoresist 132 with respect to the non-exposed portions of the photoresist 132. In the example of FIG. 2B, the result is that the trenches 134 are formed in the layer of photoresist 132. The trenches 134 corresponds to the pattern of the layout associated with the mask or reticle utilized in the photolithography process.

Figure 2C:
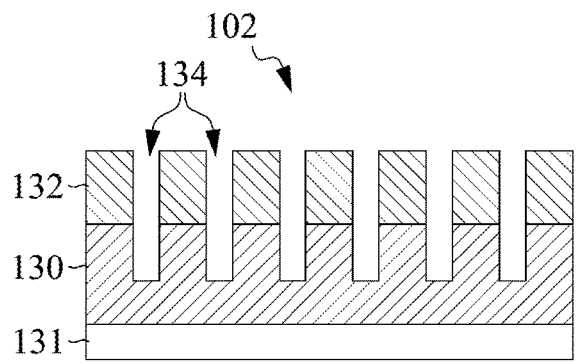

In FIG. 2C, and etching processes been performed. The etching process can include a wet etch or dry etch. The etching process is an anisotropic etch that etches selectively in the downward direction. The etching process etches the portions of the target layer 130 that are exposed in the trenches 134 in the photoresist 132. The result is that the target layer 130 is etched below the trenches 134, thereby extending the trenches 134 into the target layer 130. Various types of etching processes can be utilized without departing from the scope of the present disclosure.

Figure 2D:
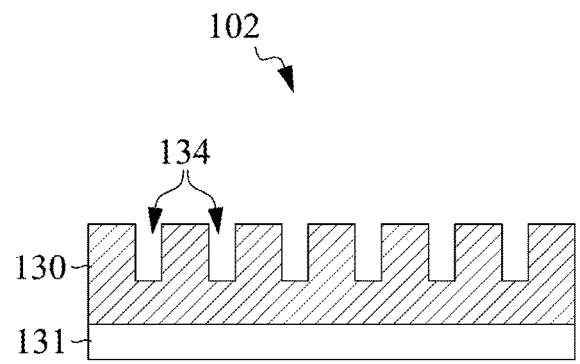

In FIG. 2D the photoresist 132 is been removed. The photoresist 132 can be removed by exposing the photoresist 132 to an etchant that selectively etches the photoresist 132 with respect to the target layer 130. The result is that the photoresist 132 is entirely removed, thereby exposing the entirety of the target layer 130. The trenches 134 remains on the target layer 130.

Figure 2E:
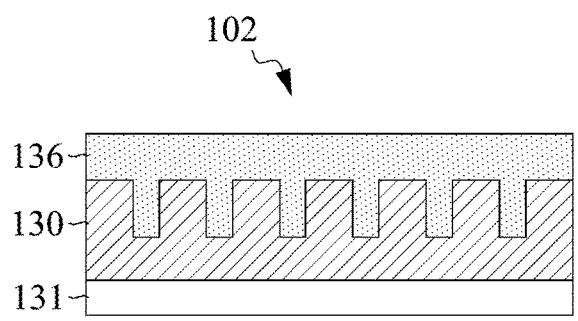

In FIG. 2E, a metal 136 is been deposited on the target layer 130. The metal 136 entirely fills the trenches 134. The metal 136 also accumulates on the top surface of the target layer 130. The metal can include tungsten, copper, titanium, aluminum, gold, or other suitable metals. The metal 136 can be deposited by physical vapor deposition (PVD), atomic layer deposition (ALD), or chemical vapor deposition (CVD). The metal 136 can have a thickness between 5 nm and 30 nm. In practice, the thickness of the metal 136 is selected to ensure that the trenches 134 entirely filled with the metal 136. Other materials, deposition processes, and thicknesses can be utilized for the metal 136 without departing from the scope of the present disclosure.

Figure 2F:
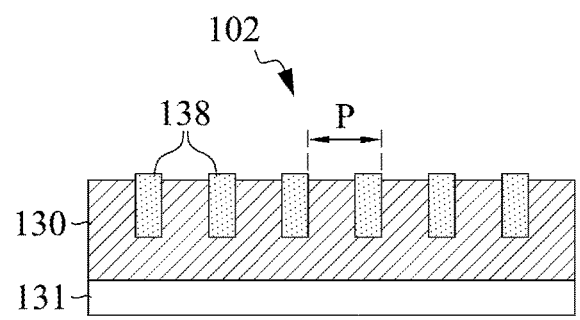

In FIG. 2F, a planarization processes been performed to remove the metal 136 from the top surface of the target layer 130. This process can include a CMP process that ensures the top surface of the target layer 130 is planar. The result of the planarization process is that individual metal lines 138 remains in the trenches 134. The individual metal lines 138 are electrically and physically separated from each other.

The metal lines 138 having a pitch P. As used herein, the pitch P can be defined as the distance between a portion of a feature and the corresponding portion of an adjacent feature. In the example of FIG. 2F, the pitch corresponds to the distance between the right edge of a metal line 138 and the right edge of an adjacent metal line 138. Alternatively, the pitch can be defined as a center to center distance, a left edge to left edge distance, or the distance between other analogous parts of two adjacent metal lines 138.

The EUV photolithography process described in relation to FIGS. 2A-2F is a single exposure photolithography process. The photoresist 132 is exposed to EUV light only a single time. The pattern of the reticle or mask can be transferred to the photoresist 132 with a single exposure.

Due to the nature of EUV photolithography, as described previously, a single exposure process can be utilized to generate pitches P less than 71 nm. In the example of FIGS. 2A-2F, the pitches may be between 20 nm and 71 nm, though other values may be utilized without departing from the scope of the present disclosure.

It is possible to form features with pitches less than 71 nm utilizing the 193i photolithography system 108. However, these processes are more complex and utilize more steps than EUV processes performed with the EUV photolithography system 106. One example of a 193i photolithography process that can be utilized to form features with pitches less than 71 nm is at a single exposure plus spacer technique. In the single exposure plus spacer technique, photoresist 132 is deposited on a target layer 130 as shown in FIG. 2A. Trenches 134 are then formed in the photoresist 132. However, the trenches 134 in the 193i photolithography process are initially much wider than the trenches 134 of FIG. 2B in the EUV photolithography process, due to the limitations of 193i photolithography processes. A thin spacer layer is then conformally deposited on top of the photoresist 132, on sidewalls of the photoresist 132 in the trenches 134, and on the exposed surfaces of the target layer 130 in the trenches 134. The thickness of the spacer layer is selected to correspond to the desired width of the metal lines (or other features) to be formed in the target layer 130.

After deposition of the spacer layer, and etching processes performed to remove the spacer layer from the top surfaces of the photoresist 132 and the target layer 130. The result is that the spacer layer only remains on sidewalls of the trenches 134 in the photoresist 132. A mandrel material is then deposited on the exposed portions of the top surface of the target layer 130 between the remaining portions of the spacer layer. In practice, the mandrel material is conformally deposited and then recessed so that the mandrel material only remains between the remaining portions of the spacer layer. Remaining portions of the mandrel material correspond to individual mandrels positioned on the target layer 130 between the remaining portions of the spacer layer on the sidewalls of the photoresist 132.

After formation of the mandrels, the remaining portions of the spacer layer are entirely removed. Because the spacer layer had a thickness corresponding to the desired thickness (or CD) of the metal lines to be formed in the target layer 130, after removal of the spacer layer, there are gaps between the mandrels and the photoresist 132 having a width corresponding to desired thickness of the metal lines to be formed in the target layer 130. The target layer 130 is exposed in the gaps. Trenches can be etched in the target layer 130 via the gaps between the mandrels and the photoresist 132.

After the trenches have been etched, the mandrels and the photoresist 132 can be removed. Metal lines 138 can then be formed in the trenches substantially as shown in relation to FIGS. 2E and 2F. The metal lines 138 formed using the single exposure 193i photolithography plus spacer technique may have the same pitch as a single exposure EUV process. However, the single exposure 193i photolithography plus spacer technique is far more complex and time-consuming than the single exposure EUV process. Accordingly, when a layout 112 calls for pitches less than 71 nm or to form, it may be beneficial to select the EUV photolithography system 108 to perform the photolithography process.

Another process that can be utilized to form pitches less than 71 nm with the 193i photolithography system 108 is a multiple exposure photolithography scheme. In the multiple exposure photolithography scheme, trenches 134 are formed in the target layer 130 with multiple photolithography exposure steps. In a first exposure step, a first set of trenches are formed substantially as shown in FIGS. 2A-2D, but with approximately double the desired final pitch. The initial photoresist is then removed and the second layer of photoresist is then deposited on the target layer 130. A second exposure process is performed with the mask shifted such that a second set of trenches is formed halfway between the first set of trenches in a process that is substantially a repeat of the process of FIGS. 2A-2D. After the second set of trenches are formed interleaved with the first set of trenches, final pattern of trenches has the desired pitch and may be approximately equal to the pitch shown in FIG. 2F. However, this process requires approximately double the number of steps as a single exposure EUV process. Furthermore, if the second set of trenches is not shifted directly between the first set of the trenches during the second exposure process, then the pitches between adjacent trenches will not be equal.

Accordingly, if a layout calls for features that have pitches less than what can be formed with a 193i photolithography process without the use of a spacer technique or multiple exposures, then it may be beneficial to utilize the EUV photolithography process. Nevertheless, there may be cases in which is still overall more desirable to have a 193i photolithography process even if there are pitches less than 71 nm. The circumstances can include if there is only a small number of such pitches, if the pitches are uniform between adjacent features, or perhaps other sensitive sensors. Accordingly, as described previously, various selection rules can be implemented by a layout analyzer 114 to determine if an EUV photolithography process should be used instead of a 193i photolithography process for a particular layout.

Figure 3:
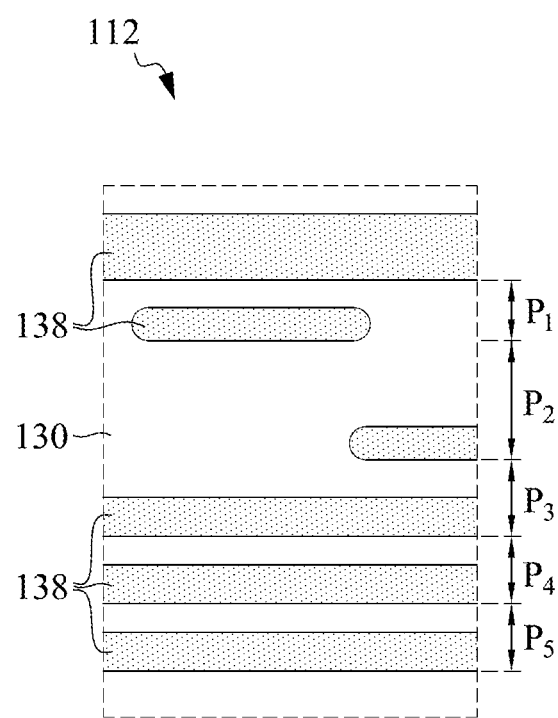
FIG. 3-6 are top views of layouts associated with a wafer, in accordance with some embodiments.

FIG. 3 illustrates a layout 112, in accordance with some embodiments. The layout 112 corresponds to a top view of a desired pattern to be implemented in a wafer 102 at a particular stage of processing. In the example of FIG. 3, the layout 112 corresponds to a top view of metal lines 138 to be formed in a target layer 130 corresponding to interlevel dielectric layer. The layout 112 is not an actual wafer, even though features of the labeled using similar labels as FIGS. 2A-2F. Instead, the layout 112 is a visual representation of a layout plan stored in the layout database 110 as described in relation to FIG. 1.

The layout analyzer 114 analyzes the layout 112 and identifies pitch data 118. The pitch data 118 indicates that there are multiple different pitches. A first pitch P1 may be less than 71 nm, or some other threshold pitch value. A second pitch P2 may be greater than the threshold pitch value, and, in any case, is significantly different than the first pitch P1. The pitches P3-P5 may be identical to the pitch P1.

The layout analyzer 114 analyzes the layout feature data 116 associated with the layout 112 of FIG. 3 and compares the layout feature data 116 to selection rules data 122. The selection rules data may indicate that if there are pitches less than 71 nm, if the pitches are not periodic, and if there are different pitches, then the EUV photolithography system 106 should be utilized to perform the photolithography process associated with the layout 112. Alternatively, the layout rules may determine that even though there are some pitches less than a threshold pitch value, the 193i photolithography system 108 may be used to perform the photolithography process associated with the layout 112.

Figure 4:
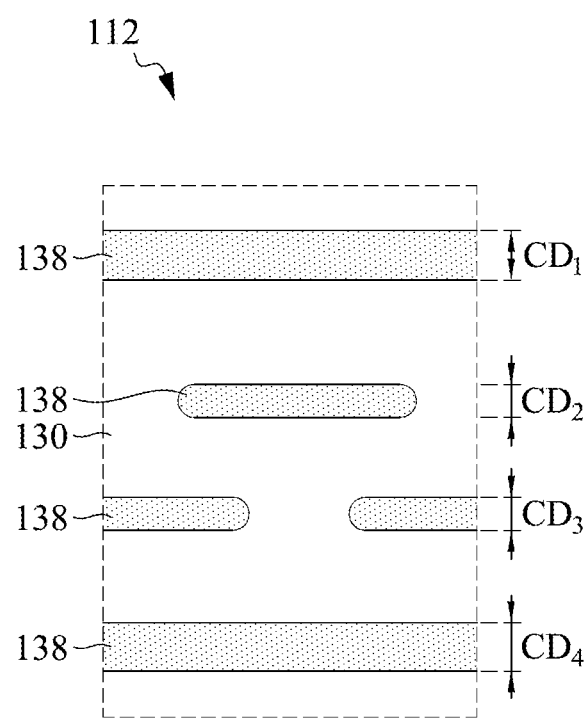

FIG. 4 illustrates a layout 112, in accordance with some embodiments. The layout 112 corresponds to a top view of a desired pattern to be implemented in a wafer 102 at a particular stage of processing. In the example of FIG. 4, the layout 112 corresponds to a top view of metal lines 138 to be formed in a target layer 130 corresponding to an interlevel dielectric layer. The layout 112 is not an actual wafer, even though features are labeled using similar reference numbers as FIGS. 2A-2F. Instead, the layout 112 is a visual representation of a layout plan stored in the layout database 110 as described in relation to FIG. 1.

The layout analyzer 114 analyzes the layout 112 and identifies CD data 120. The CD data 120 indicates that there are multiple different CDs. A first CD, CD1 may be greater than 30 nm, or some other threshold CD value. A second CD, CD2, may be less than the threshold CD value, and, in any case, is significantly smaller than the CD1. CD3 may be equal to CD2. CD four may be equal to CD1.

The layout analyzer 114 analyzes the layout feature data 116 associated with the layout 112 of FIG. 4 and compares the layout feature data 116 to selection rules data 122. The selection rules data may indicate that if there are CDs less than a threshold CD value and if there are different CDs, then the EUV photolithography system 106 should be utilized to perform the photolithography process associated with the layout 112. Alternatively, the layout rules may determine that even though there are some CDs less than a threshold CD value, the 193i photolithography system 108 may be used to perform the photolithography process associated with the layout 112.

Figure 5:
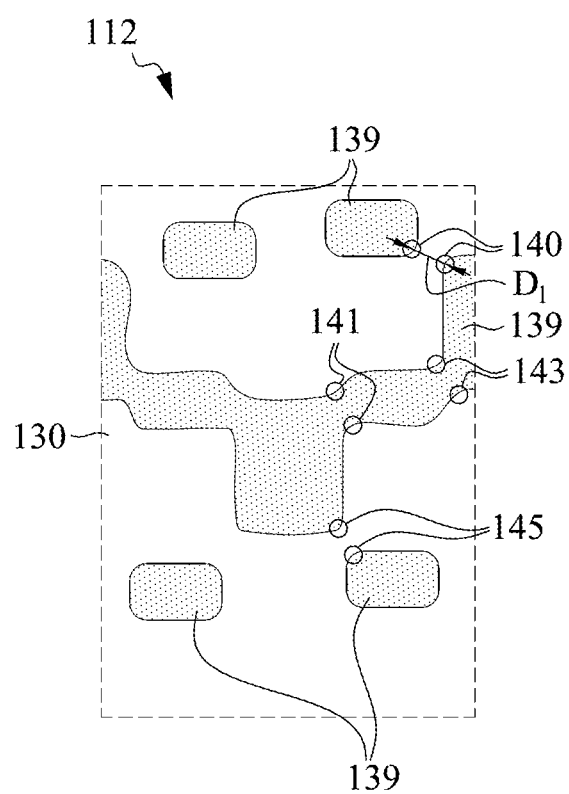

FIG. 5 is an illustration of a layout 112 associated with a particular stage of processing of a wafer 102, in accordance with some embodiments. In one example, the layout 112 of FIG. 5 corresponds to a main cut associated with formation of gate all around nanostructure transistors. The layout 112 includes features 139. The features 139 can include conductive vias, semiconductor structures, metal lines, trench isolations, or other types of features formed in the target layer 130. FIG. 5 illustrates pairs of exterior corners 140 and 145. The exterior corners 140 correspond to an adjacent corners of adjacent features 139. The exterior corners 145 correspond to adjacent exterior corners of adjacent features 139. FIG. 5 also illustrates pairs of interior corners 141 and 143. The interior corners 141 correspond to an adjacent interior corners of a single feature 139. The interior corners 143 correspond to other adjacent interior corners of a single feature 139.

The corners of each pair may be separated by various distances. For example, the exterior corners 140 may be separated by first distance D1. The interior corners 141 may be separated by a second distance D2. The interior corners 143 may be separated by a third distance D3. The exterior corners 145 may be separated by a fourth distance D4. The layout analyzer 114 may analyze the layout feature data 116 including the distances D1-D4 and may compare the distances D1-D4 to selection rules data 122. The selection rules data 122 may include a threshold interior corners distance and a threshold exterior corners distance. The threshold interior corners distance may be similar to a threshold CD. The threshold exterior corners distance may be similar to the threshold pitch. The selection rules data 122 may indicate that if one or more of the interior or exterior corners distances is less than a threshold interior corners or exterior corners distance, then the EUV photolithography system 106 should be utilized for the corresponding photolithography process. In some cases, a single exposure EUV system may replace up to six 193i photolithography exposure processes. Various selection rules data 122 related to interior and exterior corners distances can be utilized without departing from the scope of the present disclosure. Furthermore, exterior and interior corners distance rules can be combined with pitch and CD rules by the selection rules data 122 in order to determine which photolithography system should be used.

Figure 6:
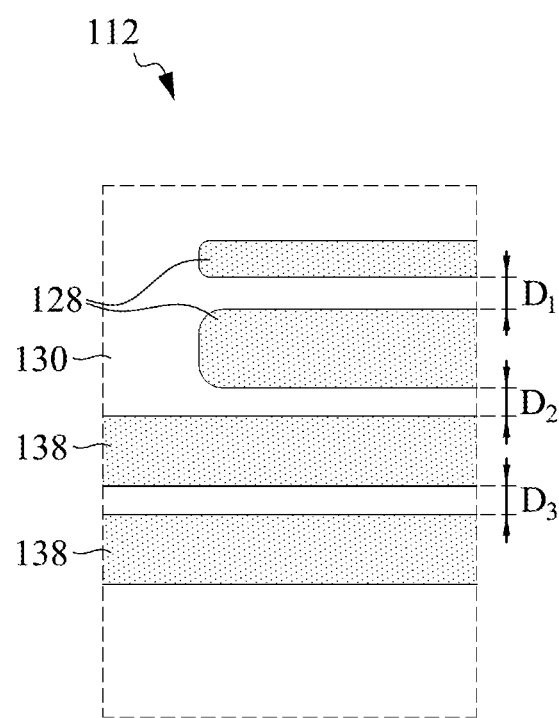

FIG. 6 is an illustration of a layout 112, in accordance with some embodiments. The layout 112 corresponds to the layout of metal lines 138 and a particular level of a wafer 102. The layout analyzer 114 extract layout feature data 116 and identifies the distances D1-D3 between adjacent metal lines 138. The selection rules data 122 may indicate a threshold separation distance between metal lines. In example, the threshold separation distance may be between 15 and 25 nm, though other threshold separation distances may be utilized without departing from the scope of the present disclosure. If the distances D1-D3 are less than a threshold metal line separation distance, then the selection rules data 122 may indicate that the layout analyzer 114 should select the EUV photolithography system 106 to perform the photolithography process associated with the layout 112.

In FIG. 6, the separation distances D1-D3 are equal and may all be less than a threshold separation distance. However, in other cases, there may be various distances between adjacent metal lines. Furthermore, there may be various pitches and CDs associated with the metal lines. The separation rules data 122 can define numerous rules related to threshold pitches, threshold separation distances, threshold CDs, threshold corner separation distances, pitch differences, CD differences, ratios of different pitches, ratios of different CDs, ratios of different metal line separation distances, ratios of different corner separation distances, or combinations of such factors.

Figure 7:
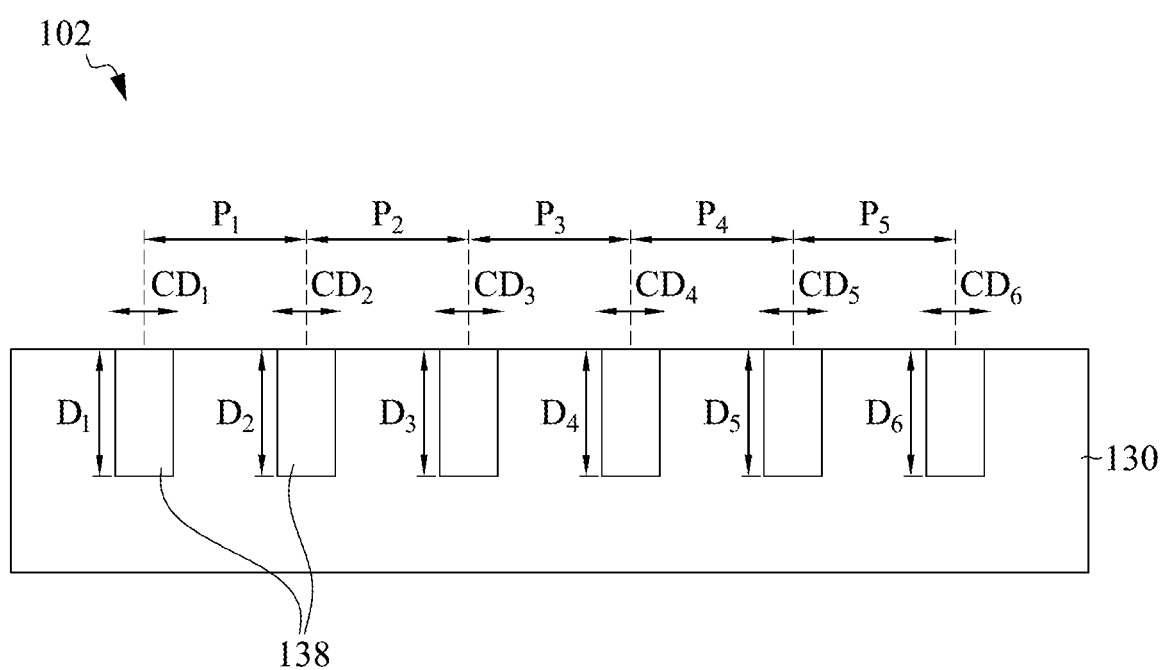
FIG. 7 is a cross-sectional view of a wafer, in accordance with some embodiments.

FIG. 7 is a cross-sectional view of a wafer 102, in accordance with some embodiments. The wafer 102 includes metal lines 138 formed in a target layer 130 accordance with an EUV photolithography process. The metal lines 138 properly reflect the desired features of accordance with a layout 112. The metal lines define pitches P1-P5, CD1-CD6, and depths D1-D6. Due to the nature of the single exposure EUV photolithography process, the pitches P1-P5 are equal to each other, the critical dimensions CD1-6 are equal to each other, and the depths D1-D6 are equal to each other.

However, if the 193i photolithography process with spacer technique is utilized to form the metal lines 138, then it is very likely that the pitches P1-P5 will not all be equal. In particular, pitches P1, P3, P5 may be the same as each other, but pitches P2 and P4 may be different from pitches P1, P3, and P5. If the 193i photolithography process with multiple exposure and multiple etching technique is utilized, then there may be differences in the pitches P1-P5, CDs1-6, and depths D1-D6 due to the nature of the multiple exposure technique. Accordingly the layout analyzer 114, in accordance with the selection rules data 122, may determine that the EUV photolithography system 106 be utilized to perform the photolithography process associated with the layout 112.

Figure 8:
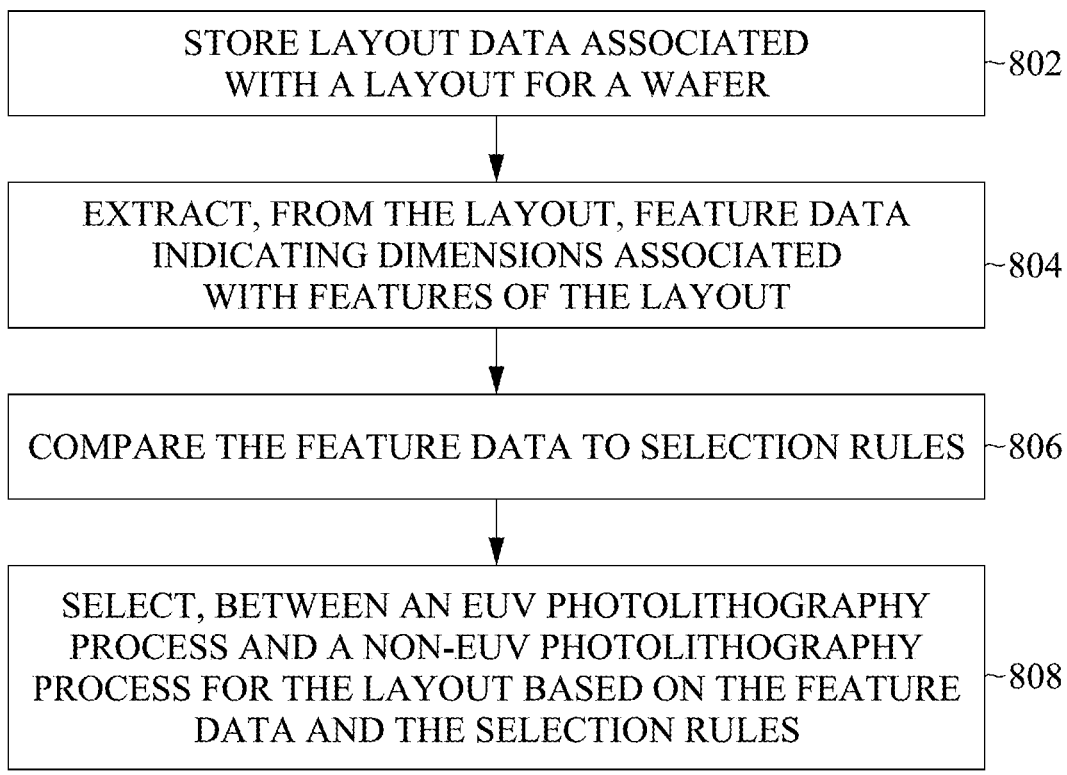
FIG. 8 is a flow diagram of a process for processing a wafer, in accordance with some embodiments.

FIG. 8 is a flow diagram of a method 800 for processing a wafer, in accordance with some embodiments. The method 800 can utilize processes, structures, and components described in relation to FIGS. 1-7. At 802, the method 800 includes storing layout data associated with a layout for a wafer. One example of layout data is the layout data 110 of FIG. 1. One example of a layout is the layout 112 of FIG. 1. One example of a wafer is the wafer 102 of FIG. 1. At 804, the method 800 includes extracting, from the layout, feature data indicating dimensions associated with features of the layout. One example of feature data is the layout feature data 116 of FIG. 1. At 806, the method 800 includes comparing the feature data to selection rules. One example of selection rules is the selection rules data 122 of FIG. 1. At 808, the method 800 includes selecting, between an EUV photolithography process and a non-EUV photolithography process for the layout based on the feature data and the selection rules.

Figure 9:
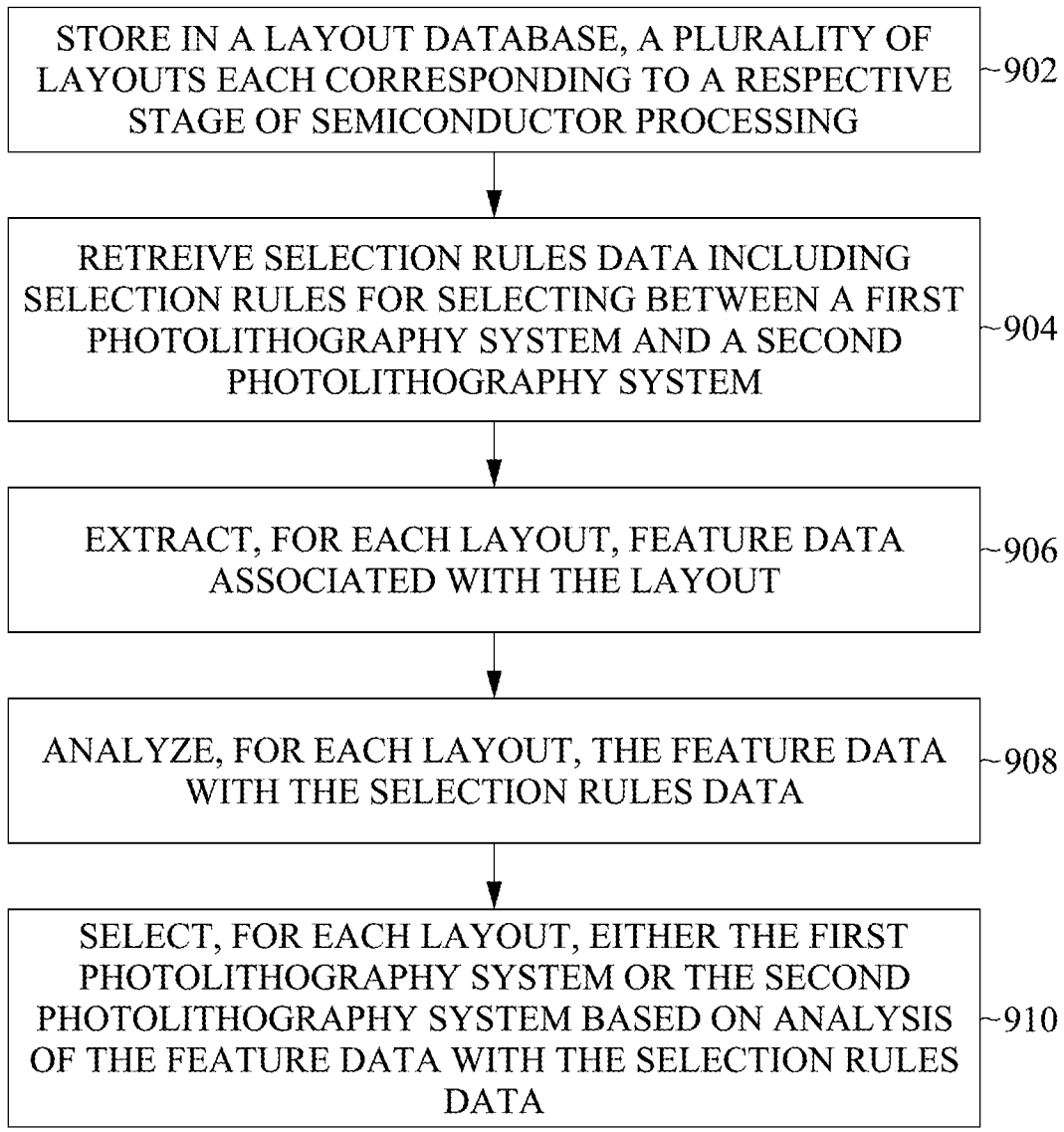
FIG. 9 is a flow diagram of a process for processing a wafer, in accordance with some embodiments.

FIG. 9 is a flow diagram of a method 900 for processing a wafer, in accordance with some embodiments. The method 900 can utilize processes, structures, and components described in relation to FIGS. 1-8. At 902, the method 900 includes storing, in a layout database, a plurality of layouts each corresponding to a respective stage of semiconductor processing. One example of a layout database is the layout database 110 of FIG. 1. One example of layouts are the layouts 112 of FIG. 1. At 904, the method 900 includes retrieving selection rules data including selection rules for selecting between a first photolithography system and a second photolithography system. One example of selection rules data is the selection rules data 122 of FIG. 1. One example of a first photolithography system is the EUV photolithography system 106 of FIG. 1. One example of a second photolithography system is the 193i photolithography system of FIG. 1. At 906, the method 900 includes extracting, for each layout, feature data associated with the layout. One example of feature data is the layout feature data 116 of FIG. 1. At 908, the method 900 includes analyzing, for each layout, the feature data with the selection rules data. At 910, the method 900 includes selecting, for each layout, either the first photolithography system or the second photolithography system based on analysis of the feature data with the selection rules data.

Embodiments of the present disclosure provide a semiconductor process system that selects among different types of photolithography processes for each of a plurality of layouts to be utilized in processing semiconductor wafers. The semiconductor process system includes a layout database and a layout analyzer. The layout database includes the layout data associated with each photolithography mask to be utilized in processing semiconductor wafers. The layout analyzer analyzes the layout of features associated with each mask. The layout analyzer may analyze the distribution of critical dimensions (CDs), pitches, and other aspects associated with the layouts. The layout analyzer processes the layout feature data in accordance with selection rules data. The selection rules data determines which type of photolithography process should be utilized for a given layout. The layout analyzer selects, for each layout, a type of photolithography process to be utilized in imparting the layout onto a semiconductor wafer.

The layout analysis and photolithography process selection has various benefits. For example, when very small pitches, CDs, or other dimensional aspects of a layout are detected by the layout analyzer, the layout analyzer selects an extreme ultraviolet (EUV) photolithography process that can most reliably impart the corresponding pattern to the semiconductor wafer. In cases in which a layout does not include very small pitches, CDs, or other dimensional aspects, the layout analyzer may select photolithography processes other than EUV photolithography processes. These other photolithography processes may be well suited to imparting patterns with relaxed dimensional constraints. The result is that photolithography resources are effectively managed, layout features are properly and reliably imparted to wafers, and wafer yields increase.

In some embodiments, a method includes storing layout data associated with a layout for a wafer and extracting, from the layout, feature data indicating dimensions associated with features of the layout. The method includes comparing the feature data to selection rules and selecting, between an EUV photolithography process and a non-EUV photolithography process for the layout based on the feature data and the selection rules.

In some embodiments, a method includes storing, in a layout database, a plurality of layouts each corresponding to a respective stage of semiconductor processing and retrieving selection rules data including selection rules for selecting between a first photolithography system and a second photolithography system. The method includes extracting, for each layout, feature data associated with the layout, analyzing, for each layout, the feature data with the selection rules data, and selecting, for each layout, either the first photolithography system or the second photolithography system based on analysis of the feature data with the selection rules data.

In some embodiments, a semiconductor processing system includes a first photolithography system and a second photolithography system. The system includes a layout database including a plurality of layouts each indicating features to be formed in a wafer and a layout analyzer configured to extract layout feature data from each layout, to compare the feature data for each layout to selection rules, and to select, for each layout, either the first photolithography system or the second photolithography system based on the feature data and the selection rules data.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method performed by a semiconductor processing system, comprising:
storing, in the semiconductor processing system, layout data associated with a layout for a wafer;
extracting, by the semiconductor processing system, from the layout, feature data indicating dimensions associated with features of the layout;
comparing, by the semiconductor processing system, the feature data to selection rules;
selecting, by the semiconductor processing system, between an EUV photolithography process and a non-EUV photolithography process for the layout based on the feature data and the selection rules, wherein the feature data includes pitch data indicating dimensions of pitches associated with the features of the layout, wherein the selection rules data includes a threshold pitch value and a threshold percentage value, wherein the selection rules indicate that the EUV photolithography process should be used if a percentage of the pitches smaller than the threshold pitch value is less than the threshold percentage value, wherein the threshold percentage value is less than 100% and greater than 0%; and
performing the selected photolithography process on a wafer for the layout.

2. The method of claim 1, wherein the feature data includes critical dimension data indicating critical dimensions associated with the features of the layout.

3. The method of claim 2, wherein the selection rules data includes a threshold critical dimension value.

4. The method of claim 3, wherein the selection rules indicate that the EUV photolithography process should be used based on whether a selected number of the critical dimensions are smaller than the threshold critical dimension value.

5. The method of claim 1, wherein the feature data includes corner distance data indicating distances between corners of one or more features of the layout.

6. The method of claim 5, wherein the selection rules data includes a threshold corner separation value.

7. The method of claim 6, wherein the selection rules indicate that the EUV photolithography process should be used based on whether a selected number of the corner separation distances are smaller than the threshold corner separation value.

8. The method of claim 1, wherein the non-EUV photolithography process is a 193i photolithography process.

9. The method of claim 1, wherein the threshold percentage value is between 45% and 55%.

10. A method, comprising:
storing, in a semiconductor processing system, a plurality of layouts each corresponding to a respective stage of semiconductor processing;
retrieving selection rules data including selection rules for selecting between a first photolithography system and a second photolithography system, wherein the first photolithography system is an EUV photolithography system;
extracting, for each layout, feature data associated with the layout;
analyzing, for each layout, the feature data with the selection rules data;
selecting, for each layout, either the first photolithography system or the second photolithography system based on analysis of the feature data with the selection rules data, wherein the feature data includes pitch data indicating dimensions of pitches associated with the features of the layout, wherein the selection rules data includes a threshold pitch value and a threshold percentage value, wherein the selection rules indicate that the EUV photolithography process should be used if a percentage of the pitches smaller than the threshold pitch value is less than the threshold percentage value, wherein the threshold percentage value is less than 100% and greater than 0%; and
performing, for each layout, the selected photolithography process on a wafer.

11. The method of claim 10, wherein the second photolithography process is a 193i photolithography process.

12. The method of claim 10, further comprising adjusting one or more layouts responsive to selecting the first photolithography process.

13. The method of claim 12, further comprising adjusting a wafer fabrication process associated with the one or more layouts responsive to selecting the first photolithography process.

14. A semiconductor processing system, comprising:
a first photolithography system, wherein the first photolithography system is an EUV photolithography system;
a second photolithography system;
the semiconductor processing system configured to:
store a plurality of layouts each indicating features to be formed in a wafer; and
extract layout feature data from each layout, to compare the feature data for each layout to selection rules, and to select, for each layout, either the first photolithography system or the second photolithography system based on the feature data and the selection rules data, wherein the feature data includes pitch data indicating dimensions of pitches associated with the features of the layout, wherein the selection rules data includes a threshold pitch value and a threshold percentage value, wherein the selection rules indicate that the EUV photolithography process should be used if a percentage of the pitches smaller than the threshold pitch value is less than the threshold percentage value, wherein the threshold percentage value is less than 100% and greater than 0%,
wherein the semiconductor processing system is configured to perform the selected photolithography process on a wafer for each layout.

15. The semiconductor processing system of claim 14, wherein the semiconductor processing system is further configured to adjust process steps associated with a layout based on whether the first or the second photolithography system is selected for the layout.

16. The semiconductor processing system of claim 14, wherein the threshold percentage value is between 45% and 55%.

17. The semiconductor processing system of claim 14, wherein the feature data includes corner distance data indicating distances between corners of one or more features of the layout.

18. The semiconductor processing system of claim 17, wherein the selection rules data includes a threshold corner separation value.

19. The semiconductor processing system of claim 18, wherein the selection rules indicate that the EUV photolithography process should be used based on whether a selected number of the corner separation distances are smaller than the threshold corner separation value.

20. The semiconductor processing system of claim 14, wherein the second photolithography process is a 193i photolithography process.

* * * * *